(12) United States Patent
Di Sarro et al.

(10) Patent No.: US 8,987,073 B2
(45) Date of Patent: Mar. 24, 2015

(54) SELF-PROTECTED METAL-OXIDE-SEMICONDUCTOR FIELD-EFFECT TRANSISTOR

(75) Inventors: James P. Di Sarro, Essex Junction, VT (US); Robert J. Gauthier, Jr., Hinesburg, VT (US); Junjun Li, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 289 days.

(21) Appl. No.: 13/546,509

(22) Filed: Jul. 11, 2012

(65) Prior Publication Data
US 2014/0015053 A1 Jan. 16, 2014

(51) Int. Cl.
| H01L 21/00 | (2006.01) |
| H01L 21/84 | (2006.01) |
| H01L 27/02 | (2006.01) |
| H01L 27/12 | (2006.01) |
| H01L 29/66 | (2006.01) |

(52) U.S. Cl.
CPC .......... H01L 29/66636 (2013.01); H01L 21/84 (2013.01); H01L 27/0251 (2013.01); H01L 27/1203 (2013.01); H01L 29/66545 (2013.01)
USPC .............................. 438/155; 438/558; 438/238

(58) Field of Classification Search
CPC ......................... H01L 29/786; H01L 27/0251
USPC ......................................... 438/558, 155, 238
See application file for complete search history.

(56) References Cited

U.S. PATENT DOCUMENTS

| 5,468,667 | A | 11/1995 | Diaz et al. |
| 7,221,036 | B1 | 5/2007 | Vashchenko et al. |
| 7,375,000 | B2 | 5/2008 | Nowak et al. |
| 7,804,671 | B2 | 9/2010 | Cheng et al. |
| 7,927,944 | B1 | 4/2011 | Ransom et al. |
| 8,080,832 | B1 | 12/2011 | Boyd et al. |
| 8,361,895 | B2 * | 1/2013 | Lin et al. ........................ 438/558 |
| 2009/0134468 | A1 | 5/2009 | Tsuchiya et al. |
| 2011/0260287 | A1 | 10/2011 | Lee |
| 2012/0043583 | A1 | 2/2012 | Abou-Khalil et al. |

(Continued)

FOREIGN PATENT DOCUMENTS

| EP | 622850 A1 | 11/1994 |
| JP | 4129249 A | 4/1992 |
| JP | 7015016 A | 1/1995 |

OTHER PUBLICATIONS

Salman, et al., "ESD-Induced Oxide Breakdown on Self-Protecting GG-nMOSTFET in 0.1-um CMOS Technology", IEEE Transactions on Device and Materials Reliability, vol. 3, No. 3, Sep. 2003.

(Continued)

*Primary Examiner* — Laura Menz
(74) *Attorney, Agent, or Firm* — Wood, Herron & Evans, LLP; Anthony J. Canale (57) ABSTRACT

Device structures, design structures, and fabrication methods for a metal-oxide-semiconductor field-effect transistor. A gate structure is formed on a top surface of a substrate. First and second trenches are formed in the substrate adjacent to a sidewall of the gate structure. The second trench is formed laterally between the first trench and the first sidewall. First and second epitaxial layers are respectively formed in the first and second trenches. A contact is formed to the first epitaxial layer, which serves as a drain. The second epitaxial layer in the second trench is not contacted so that the second epitaxial layer serves as a ballasting resistor.

9 Claims, 4 Drawing Sheets

(56) References Cited

U.S. PATENT DOCUMENTS

2012/0146150 A1 6/2012 Gauthier, Jr. et al.
2014/0015053 A1* 1/2014 Di Sarro et al. ............... 257/350

OTHER PUBLICATIONS

Salman, et al., "NMOSFET ESD Self-Proection Strategy and Underlying Failure Mechanism in Advanced 0.13-um CMOS Technology", IEEE Transactions on Device and Materials Reliability, vol. 2, No. 1, Mar. 2002.

Mitra, et al., "ESD Protection Using Grounded Gate, Gate Non-Silicided (GG-GNS) ESD NFETs in 45nm SOI Technology", EOS/ESD/ Symposium 2008.

Li, et al., "Capacitance Investigation of Diode and GGNMOS for ESD Protection of High Frequency Circuits in 45nm SOI CMOS Technologies", Electrical Overstress/Electrostatic Discharge Symposium, 2008.

* cited by examiner

SELF-PROTECTED METAL-OXIDE-SEMICONDUCTOR FIELD-EFFECT TRANSISTOR

BACKGROUND

The present invention relates to semiconductor devices and device fabrication and, more specifically, to device structures, fabrication methods, and design structures for metal-oxide-semiconductor field-effect transistors.

An integrated circuit (IC) is susceptible to damage from fast, transient, and high-voltage electrostatic discharge (ESD) events. Among the sources of IC exposure to ESD events are the human body described by the Human Body Model, metallic objects described by the Machine Model, and the IC itself should the IC charge and discharge to ground as described by the Charged Device Model. A common scheme to protect an input/output (I/O) pad uses a metal-oxide-semiconductor field-effect transistor (MOSFET) with a drain connected to the I/O pad and a source tied to ground. During an ESD event, the MOSFET supplies a low impedance current path to ground and diverts the ESD current away from the IC coupled with the I/O pad.

Device structures, fabrication methods, and design structures are needed for a MOSFET to provide protection from the detrimental effects of an ESD event.

SUMMARY

According to one embodiment of the present invention, a device structure includes a gate structure on a top surface of the substrate, a first trench in the substrate adjacent to a first sidewall of the gate structure, and a second trench in the substrate adjacent to the first sidewall of the gate structure. The second trench is disposed laterally between the first trench and the first sidewall of the gate structure. The device structure further includes a first epitaxial layer in the first trench, a second epitaxial layer in the second trench, and a contact to the first epitaxial layer. The second epitaxial layer is not contacted.

According to another embodiment of the present invention, a fabrication method includes forming a gate structure on a top surface of a substrate and forming first and second trenches in the substrate adjacent to a first sidewall of the gate structure. The second trench is formed laterally between the first trench and the first sidewall. First and second epitaxial layers are respectively formed in the first and second trenches. The method further comprises forming a contact to the first epitaxial layer. The second epitaxial layer is not contacted.

According to another embodiment of the present invention, a design structure is provided that is readable by a machine used in design, manufacture, or simulation of an integrated circuit. The design structure includes a gate structure on a top surface of the substrate, a first trench in the substrate adjacent to a first sidewall of the gate structure, and a second trench in the substrate adjacent to the first sidewall of the gate structure. The second trench is disposed laterally between the first trench and the first sidewall of the gate structure. The design structure further includes a first epitaxial layer in the first trench, a second epitaxial layer in the second trench, and a contact to the first epitaxial layer. The second epitaxial layer is not contacted. The design structure may comprise a netlist. The design structure may also reside on storage medium as a data format used for the exchange of layout data of integrated circuits. The design structure may reside in a programmable gate array.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
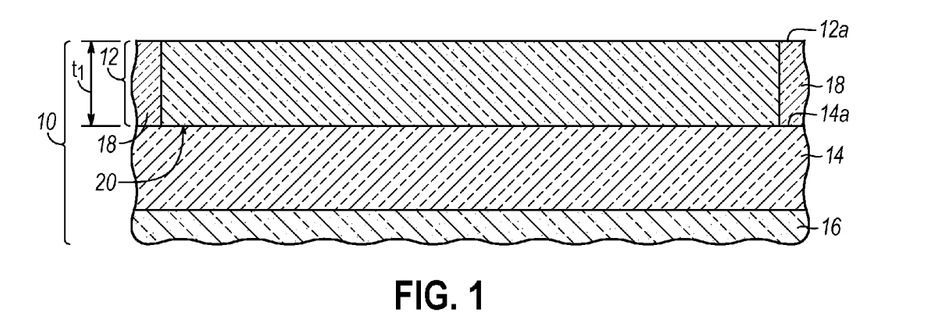
FIG. 1 is a cross-sectional view of a portion of a substrate at an initial fabrication stage of a processing method for forming a self-protected field-effect transistor in accordance with an embodiment of the invention.

With reference to FIG. 1 and in accordance with an embodiment of the invention, a semiconductor-on-insulator (SOI) substrate 10 includes a device layer 12, a buried insulator layer 14, and a handle wafer 16. The device layer 12 is separated from the handle wafer 16 by the intervening buried insulator layer 14 and is in direct contact along a planar interface with a top surface 14a of the buried insulator layer 14. The buried insulator layer 14 electrically insulates the handle wafer 16 from the device layer 12, which is considerably thinner than the handle wafer 16. The buried insulator layer 14 may be comprised of an electrical insulator and, in particular, may be comprised of silicon dioxide (e.g., $SiO_2$) to constitute a buried oxide layer.

The device layer 12 and handle wafer 16 may be comprised of a monocrystalline semiconductor material, such as single crystal silicon or another crystalline semiconductor material that contains primarily silicon, and the semiconductor material of the device layer 12 may be device quality. The device layer 12 may have a thickness, $t_1$, measured from a top surface 12a to a top surface 14a of the buried insulator layer 14 ranging from two (2) nm to 150 nm. The SOI substrate 10 may be fabricated by any suitable conventional technique, such as wafer bonding techniques or separation by implantation of oxygen (SIMOX) techniques, familiar to a person having ordinary skill in the art.

Trench isolation regions 18 circumscribe and electrically isolate a device region 20 by extending to the top surface 14a of buried insulator layer 14. The top surface 12a of the device layer 12 in device region 20 is nominally co-planar with a top surface of the trench isolation regions 18. The top surface 12a of the device layer 12 in device region 20 has a surface area with an outer perimeter bounded by the trench isolation regions 18. The trench isolation regions 18 may be formed by a shallow trench isolation (STI) technique that relies on photolithography and etching processes to define interconnected trenches that terminate at the top surface 14a of buried insulator layer 14, deposits an electrical insulator to fill the trenches, and planarizes the electrical insulator relative to the top surface 12a using a chemical mechanical polishing (CMP) process. The trench isolation regions 18 may be comprised of a dielectric material, such as an oxide of silicon and, in particular, densified tetraethylorthosilicate (TEOS) deposited by chemical vapor deposition (CVD).

Figure 2:
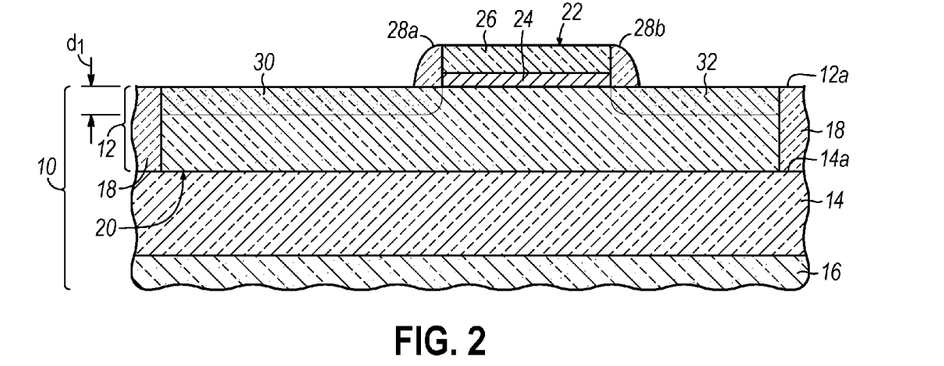
FIGS. 2-6 are cross-sectional views at successive fabrication stages of the processing method subsequent to FIG. 1.

With reference to FIG. 2 in which like reference numerals refer to like features in FIG. 1 and at a subsequent fabrication stage, a dummy gate structure 22 comprised of one or more sacrificial materials is formed on the top surface 12a of the device layer 12 in device region 20 as a removable and temporary feature in a replacement gate process. In a replacement gate process, the dummy gate structure 22 dictates the geometry and location of a later-formed gate structure of a device. In this instance, the dummy gate structure 22 is formed on the top surface 12a of the device layer 12 in device region 20 at the intended location for a gate structure of a functional field effect transistor in accordance with embodiments of the invention. The dummy gate structure 22 is laterally displaced from a horizontal centerline of the device region 20 so that the dummy gate structure 22 is not centered, or is laterally offset, relative to the device region 20.

The dummy gate structure 22 may include a plurality of layers 24, 26 in a patterned layer stack residing on the top surface 12a of the device layer 12 in device region 20. The layers 24, 26 may be comprised of materials that can be selectively etched relative to the underlying device layer 12 of the SOI substrate 10. As used herein, the term "selective" in reference to a material removal process (e.g., etching) denotes that the material removal rate for the targeted material is higher than the removal rate for at least another material exposed to the material removal process. The layers 24, 26 of the dummy gate structure 22 may be respectively comprised of a dielectric material, such as an oxide, nitride or oxynitride of silicon, and a semiconductor material, such as polysilicon. The dummy gate structure 22 may be formed by serially depositing the layers 24, 26 on the top surface 12a of the device layer 12 in device region 20 and then patterning the deposited layers 24, 26 using photolithography and etching processes.

Spacers 28a,b are formed that directly contact the sidewalls of the dummy gate structure 22. The spacers 28a,b may be formed by depositing a conformal layer of an electrically insulating material, such as about ten (10) nanometers to about fifty (50) nanometers of silicon nitride ($Si_3N_4$) deposited by CVD, and preferentially removing portions of the conformal layer with an anisotropic etching process, such as reactive ion etching (RIE). An anisotropic etching process is a wet or dry material removal process in which the etch rate in the direction normal to the surface (e.g., top surface 12a) to be etched is greater than in the direction parallel to the surface to be etched.

Shallow doped regions 30, 32 are formed in the device region 20 on opposite sides of the dummy gate structure 22. In the representative embodiment, the doped regions 30, 32 may be formed by implanting ions of an impurity species into the device layer 12 through the top surface 12a in device region 20 and in the presence of the dummy gate structure 22. The dummy gate structure 22 controls dopant introduction into the device layer 12 in device region 20 during implantation by function as a mask that stops the implanted ions within its thickness so that the device layer 12 is selectively implanted with the impurity species to respectively form the doped regions 30, 32. In particular, the dummy gate structure 22 self-aligns the doped regions 30, 32 in the device region 20 relative to the dummy gate structure 22.

The implantation conditions (e.g., kinetic energy and dose) are selected to form each of the doped regions 30, 32 with a depth profile spanning a desired depth range and having a desired doping concentration. The depth profile of the atomic concentration following implantation may be characterized by a distribution for the impurity species with a peak concentration at a projected range and a range straggle that represents a standard deviation or second moment about the projected range. The projected range of the depth profile is measured relative to the top surface 12a. In particular, the ion kinetic energy is selected such that the ions stop in the device layer 12 of the device region 20 across a depth, $d_1$, between the top surface 12a and the top surface 14a of the buried insulator layer 14. The ion kinetic energy may be selected such that the depth profile of dopant concentration for the doped regions 30, 32 intersects the top surface 12a, but does not extend vertically to the depth of the interface of the device layer 12 with the buried insulator layer 14 (i.e., top surface 14a). In one embodiment, the doped regions 30, 32 may be formed using an angled implantation process. As used herein, the term "angled implantation" denotes that the ion trajectories impinge the top surface traveling at incident angles that than 0°, wherein 0° is a direction normal (i.e., perpendicular) to the top surface. Because of the inclination of the angled implantation process, the doped regions 32, 32 also extend laterally for a short distance beneath the sidewall of the dummy gate structure 22 and spacers 28a,b.

In a representative embodiment, the doped regions 30, 32 may be oppositely doped from the device layer 12. In one embodiment, the doped regions 30, 32 may be comprised of heavily-doped semiconductor material having an n-type conductivity supplied by implanting ions of an impurity species from Group V of the Periodic Table (e.g., phosphorus (P), arsenic (As), or antimony (Sb)). The device layer 12 may comprise lightly-doped semiconductor material having a p-type conductivity supplied by an impurity species from Group III of the Periodic Table (e.g., boron (B), aluminum (Al), gallium (Ga), or indium (In)).

Figure 3:
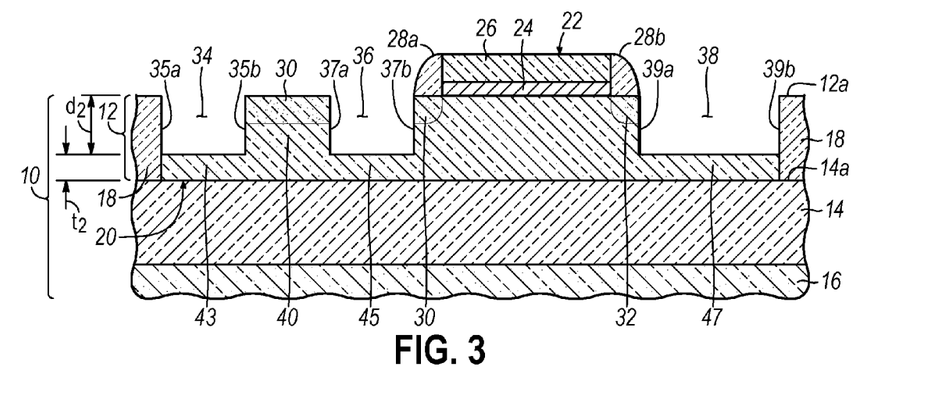

With reference to FIG. 3 in which like reference numerals refer to like features in FIG. 2 and at a subsequent fabrication stage, a plurality of trenches 34, 36, 38 are formed in the device layer 12. Trenches 34, 36 are laterally positioned on one side of the dummy gate structure 22 and trench 38 is laterally positioned on an opposite side of the dummy gate structure 22 from trenches 34, 36. Trench 36 is laterally positioned between trench 34 and the dummy gate structure 22. Minor portions of the doped regions 30, 32 also extend beneath the dummy gate structure 22. Trenches 36, 38 flank the opposite sidewalls of the dummy gate structure 22.

Each of the trenches 34, 36, 38 has sidewalls 35a,b, 37a,b, 39a,b that extend in depth from the top surface 12a only partially through the thickness of the device layer 12 within device region 20. In particular, each of the trenches 34, 36, 38 extends to a depth, $d_2$, measured relative to the top surface 12a that is less than the thickness, $t_1$, of the device layer 12. As a result, a plurality of thinned regions 43, 45, 47 of the device layer 12 respectively remain at the bottom of the trenches 34, 36, 38.

The thinned regions 43, 45, 47 of the device layer 12 have nominally the same thickness, $t_2$, that is less than the thickness, $t_1$, of the device layer 12. The depth, $d_2$, of the trenches 34, 36, 38 is deeper than the depth, $d_1$, of the doped regions 30, 32 so that the doped regions 30, 32 are locally removed by the trenching process. In particular, the continuity of doped region 30 is interrupted by the formation of trenches 34, 36. A portion 40 of the device layer 12 between the trenches 34, 36, which is masked when the trenches 34, 36, 38 are formed, nominally retains the original thickness, $t_1$, of the device layer 12 and includes the residual portion of the doped region 30. Residual portions of the doped regions 30, 32 are also present beneath the dummy gate structure 22.

The trenches 34, 36, 38 are formed by photolithography and etching processes. To that end, a photoresist layer may be applied to the top surface 12a by a spin coating process, pre-baked, exposed to a radiation projected through a photomask, baked after exposure, and developed with a chemical developer to form an etch mask that includes openings coinciding with the intended locations of trenches 34, 36, 38. The etching process is applied to form the trenches 34, 36, 38 by removing unprotected portions of the device layer 12 in the device region 20. The etching process may comprise a dry etching process, such as reactive-ion etching (RIE). The etching process, which may be conducted in a single etching step or multiple steps, relies on one or more etch chemistries and may comprise a timed etch so that the trenches 34, 36, 38 do not extend completely through the device layer 12. The photoresist layer may be removed by ashing or solvent stripping, followed by surface cleaning.

Figure 4:
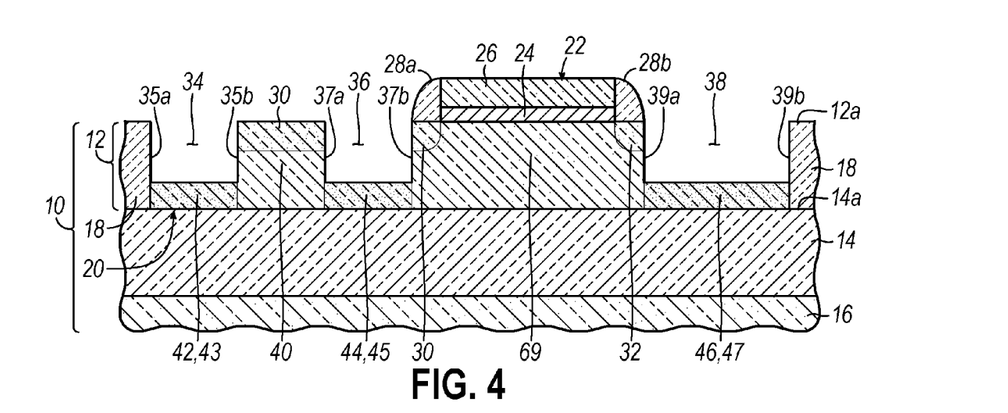

With reference to FIG. 4 in which like reference numerals refer to like features in FIG. 3 and at a subsequent fabrication stage, doped regions 42, 44, 46 are formed by doping the respective thinned regions 43, 45, 47 of the device layer 12 at the base of the trenches 34, 36, 38. In the representative embodiment, the doped regions 42, 44, 46 may be formed by an ion implantation process and may have a concentration profile that extends across the thickness of the thinned regions 43, 45, 47 of the device layer 12 at the bottom of the trenches 34, 36, 38. The dummy gate structure 22 protects a channel 69 from being ion implanted. The implantation conditions (e g, kinetic energy and dose) are selected to form each of the doped regions 42, 44, 46 over a desired depth range and with a desired doping concentration. The ion kinetic energy may be selected such that the depth profile of dopant concentration for the doped regions 42, 44, 46 extends to the top surface 14a of the buried insulator layer 14. In one embodiment, the doped regions 42, 44, 46 may have the same conductivity type as doped regions 30, 32 and may be comprised of heavily-doped semiconductor material having an n-type conductivity supplied by implanting ions of an impurity species from Group V of the Periodic Table.

Figure 5:
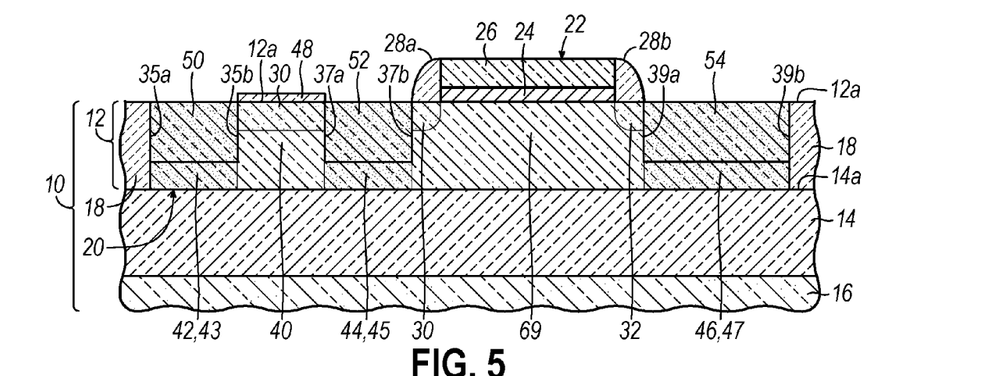

With reference to FIG. 5 in which like reference numerals refer to like features in FIG. 4 and at a subsequent fabrication stage, a hardmask 48 is applied and epitaxial layers 50, 52, 54 of semiconductor material are respectively formed in the trenches 34, 36, 38. Each of the epitaxial layers 50, 52, 54 has a bottom surface that is coextensive with one of the doped regions 42, 44, 46 due to the mutual alignment provided by the trenches 34, 36, 38. In the representative embodiment, the epitaxial layers 50, 52, 54 are formed in direct contact with the doped regions 42, 44, 46.

The epitaxial layers 50, 52, 54 may be each comprised of an epitaxially-deposited layer of semiconductor material, which may be constituted by the same base semiconductor material as the device layer 12. In one embodiment, the epitaxial layers 50, 52, 54 may be comprised of a semiconductor material (e.g., silicon) formed by an epitaxial growth process, such as vapor-phase epitaxy (VPE). Epitaxial growth is a process by which a layer of single-crystal material (epitaxial layers 50, 52, 54) is deposited or grown on a single-crystal material (the doped regions 42, 44, 46) and in which the crystallographic structure of the single-crystal material is reproduced in the epitaxial layers 50, 52, 54. As a result, the epitaxial semiconductor material of the epitaxial layers 50, 52, 54 acquires the crystalline state of the semiconductor material of device layer 12 and, following growth, the epitaxial layers 50, 52, 54 and the doped regions 42, 44, 46 may have identical crystallographic structures. The hardmask 48 may prevent epitaxial growth on the top surface 12a between the trenches 34, 36.

Respective top surfaces 51, 53, 55 of the epitaxial layers 50, 52, 54 are nominally coplanar with the top surface 12a of the device layer 12 in device region 20.

The semiconductor material comprising the epitaxial layers 50, 52, 54 may be doped during or following deposition. In one embodiment, the epitaxial layers 50, 52, 54 may be in situ doped during growth to introduce a concentration of an impurity or dopant to impart the same conductivity type as doped regions 42, 44, 46. For example, an additional source gas such as phosphine, arsine, or diborane may be introduced into the growth chamber. In particular, the epitaxial layers 50, 52, 54 may be heavily doped to have the same conductivity type as the doped regions 42, 44, 46.

Figure 6:
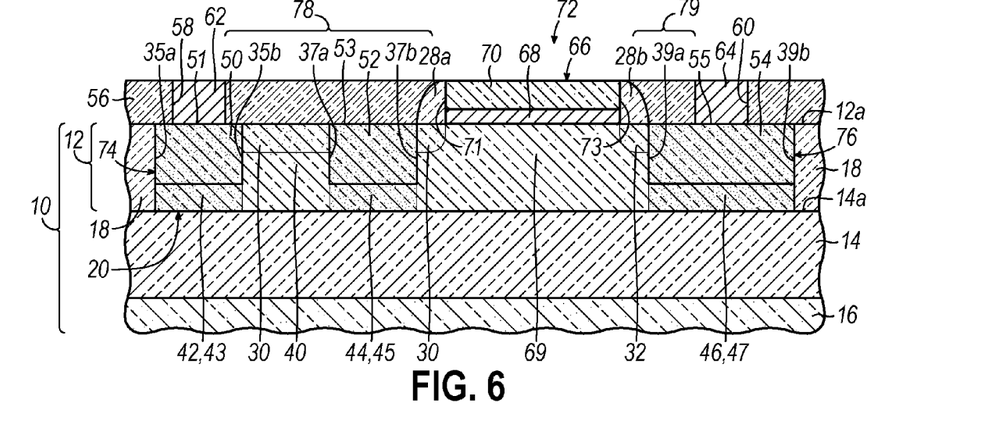
Figure 7:
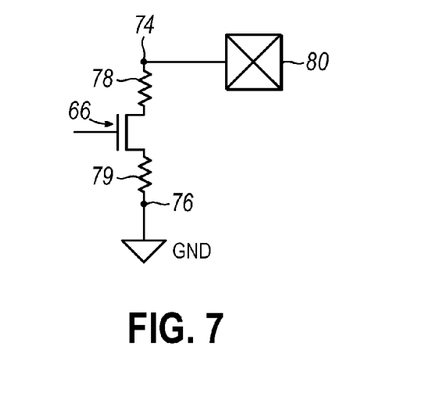
FIG. 7 is a schematic view of an electrical configuration for the device structure of FIG. 5.

With reference to FIGS. 6 and 7 in which like reference numerals refer to like features in FIG. 5 and at a subsequent fabrication stage, a dielectric layer 56 is deposited on the top surface 12a and with a thickness that covers the dummy gate structure 22 immediately following deposition. In a representative embodiment, the dielectric layer 56 may comprise a single layer of, for example, $Si_3N_4$ deposited using CVD. Following deposition, the dielectric layer 56 may be planarized until the top surface of the dummy gate structure 22 is exposed and coplanar with a top surface of the dielectric layer 56. The planarization process may comprise chemical mechanical polishing (CMP), which is a material removal process using both chemical reactions and mechanical erosion to remove material and planarize a surface.

Via openings 58, 60 may extend through a thickness of the dielectric layer 56 to the top surface 12a at locations that spatially coincide with the epitaxial layer 50 and the epitaxial layer 54. However, a via opening is not formed that would intersect a top surface 53 of epitaxial layer 52. As apparent in FIG. 6, the cross-sectional area of the via opening 58 may be smaller than the area of the top surfaces 51 of epitaxial layer 50 and the cross-sectional area of the via opening 60 may be smaller than the area of the top surface 55 of epitaxial layer 54. In other words, via opening 58 lands on less than the entire area of the top surface 51 of epitaxial layer 50 and via opening 60 lands on less than the entire area of the top surface 55 of epitaxial layer 54.

The via openings 58, 60 may be formed using photolithography and etching processes. For example, a photoresist etch mask can be produced by applying a photoresist layer to the top surface of dielectric layer 56, exposing the photoresist layer to a pattern of radiation, and then developing the pattern into the photoresist layer utilizing a resist developer. The photoresist etch mask may be patterned so that portions of the dielectric layer 56 are not protected by the photoresist etch mask at the intended locations of the via openings 58, 60. Sections of the dielectric layer 56 not protected by the photoresist etch mask are then removed by a selective etching process.

Contacts 62, 64 are formed in the respective via openings 58, 60 that extend from the top surface of the dielectric layer 56 vertically through the dielectric layer 56 and into contact with the epitaxial layers 50, 54. The top surfaces of the epitaxial layers 50, 54 may be silicided to form a thin intermetallic layer before the contacts 62, 64 are formed. However, epitaxial layer 52 is not contacted in a manner similar to epitaxial layers 50, 54. The contacts 62, 64 may be coupled with additional structures to provide a functional device.

The dummy gate structure 22 (FIG. 5) is stripped out or otherwise removed to provide an opening between the spacers 28a,b extending from a top surface of the dielectric layer 56 to the top surface 12a of the device layer 12 in device region 20. The dummy gate structure 22 may be removed using a selective etching process that removes the dummy gate structure 22 selective to the device layer 12, the spacers 28a,b, and the dielectric layer 56. The etching process may be an isotropic etch, such as a wet chemical etch, or an anisotropic etch, such as reactive-ion etching (RIE).

A functional gate structure 66 is formed in the opening in the dielectric layer 56 and replaces the dummy gate structure 22. The functional gate structure 66 may includes a gate dielectric 68 on the top surface 12a and a gate electrode 70 positioned on the gate dielectric 68 in a stacked arrangement. The channel 69 is defined in the device region 20 at a location beneath the functional gate structure 66. The functional gate structure 66 may be formed from a layer stack comprised of the constituent materials of the gate dielectric 68 and gate electrode 70. To that end, a layer stack is deposited that fills the opening in the dielectric layer 56 and a planarization process, such as CMP, is employed to planarize the top surface of the gate electrode 70 relative to a top surface of the dielectric layer 56.

The functional gate structure 66 includes a sidewall 71 and a sidewall 73 laterally spaced from sidewall 71. Spacer 28a is adjacent to sidewall 71 and spacer 28b is adjacent to sidewall 73. Trenches 34, 36 (FIG. 3) and the respective epitaxial layers 50, 52 are located adjacent to sidewall 71 with the trench 36 and epitaxial layer 52 laterally disposed between the sidewall 71 and the trench 36 and epitaxial layer 52.

The gate dielectric 68 may be comprised of an electrically-insulating material (e.g., a non-conductor). In one embodiment, the gate dielectric 68 may include one or more layers of an electrical insulator having a dielectric constant (e.g., a permittivity) characteristic of a high-k dielectric having a dielectric constant greater than 10 and, preferably, in a range of 10 to 100. In yet another embodiment, the gate dielectric layer may include a dual layer film, such as an interfacial layer comprised of a material (e.g., $SiO_2$) with a dielectric constant less than 10 and an additive layer comprised of a high-k dielectric material. Candidate high-k dielectric materials include, but are not limited to, hafnium-based dielectric materials like hafnium oxide ($HfO_2$), hafnium silicate (HfSiO), aluminum oxide ($Al_2O_3$), lanthanum oxide ($La_2O_3$), titanium dioxide ($TiO_2$), tantalum oxide ($Ta_2O_5$), zirconium oxide ($ZrO_2$), zirconium silicon oxide (ZrSiO), yttrium oxide ($Y_2O_3$), strontium oxide (SrO), or strontium titanium oxide (SrTiO), mixtures thereof, or layered stacks of these and other dielectric materials. The dielectric materials may be deposited by, for example, atomic layer deposition (ALD) or CVD. The gate dielectric 68 alternatively may be comprised of a material, such as a nitrided hafnium silicate (HfSiON), that includes nitrogen introduced by plasma nitridation.

The gate electrode 70 may include one or more layers comprised of a conductor, such as doped polycrystalline silicon (polysilicon) and/or a metal. In various embodiments, the gate electrode 70 may be comprised of one or more metals such as tungsten (W), tantalum (Ta), titanium nitride (TiN), zirconium nitride (ZrN), hafnium nitride (HfN), vanadium nitride (VN), niobium nitride (NbN), tantalum nitride (TaN), tungsten nitride (WN), titanium aluminum nitride (TiAlN), tantalum carbide (TaC), tantalum magnesium carbide (TaMgC), tantalum carbonitride (TaCN), a combination or an alloy thereof, a combination with doped polysilicon, or similar materials recognized by a person having ordinary skill in the art. The gate electrode 70 may be deposited by, for example, CVD, ALD, or physical vapor deposition (PVD).

A device structure 72, which may be characterized as a field-effect transistor, is produced by the fabrication process. The device structure 72 includes a drain 74 and a source 76, as well as a ballasting resistor 78 disposed between the drain 74 and the functional gate structure 66 and a ballasting resistor 79 disposed between the source 76 and the functional gate structure 66. The ballasting resistor 78 comprises the epitaxial layer 52, the doped region 44, the portion 40 of the device layer 12 between the trenches 34, 36, the section of doped region 30 in the portion 40, and the portion of the epitaxial layer 50 and doped region 42 between the contact 62 and the doped region 30 and portion 40. In other words, the ballasting resistor 78 includes features laterally positioned in the device layer 12 between the contact 62 and the spacer 28a. The ballasting resistor 79 comprises the portions of the epitaxial layer 54 and doped region 46 between the contact 64 and the channel 69. In other words, the ballasting resistor 79 includes features in the device layer 12 laterally positioned between the contact 64 and the spacer 28b.

Because of the lateral displacement of the dummy gate structure 22 from the horizontal centerline of the device region 20, the functional gate structure 66 is likewise laterally displaced from the horizontal centerline of the device region 20. The offset provides adequate space for the additional trench 36 and epitaxial layer 52 of ballasting transistor 78. The channel 69 beneath the functional gate structure 66 is laterally located in the device region 20 between the drain 74 and source 76 with the ballasting resistor at an intervening position between the drain 74 and the channel 69.

Although only one device structure 72 is depicted in FIG. 6, any number of device structures 72 may be formed on the SOI substrate 10. The device structure 72 may be formed without the introduction of additional masks and may utilize ion implantation processes also used to form other non-protected field-effect transistors on the SOI substrate 10. The device structure is fabricated without the use of silicide blocking (sblk) layers and may be free of silicide other than between the contacts 62, 64 and epitaxial layers 50, 54. The drain 74 and source 76 are otherwise free of silicide and sblk layers.

Standard back-end-of-line (BEOL) processing may follow the formation of the device structure 72 to form a BEOL interconnect structure. Each level of the BEOL interconnect structure may be fabricated by damascene processes, such as a dual damascene process in which a dielectric layer is deposited, vias and trenches are etched in the dielectric layer, and the vias and trenches are filled with a conductor using a single blanket deposition followed by planarization. The damascene process may be replicated to stack multiple wiring levels so that a multi-level framework of conductive interconnections is formed. Damascene processes and the materials used in damascene processes are comprehended by a person having ordinary skill in the art. In particular, the metallization of the BEOL interconnect structure may define various wiring paths, including a wiring path including contact 62 that couples an input/output (I/O) pad 80 with the drain 74 of the device structure 72 and a wiring path including contact 62 that couples the source 76 of the device structure 72 with a ground connection, GND.

The ballasting resistors 78, 79 supply the device structure 72 with a level of self-protection against damage from an ESD event occurring at the I/O pad 80. In particular, the additional resistance of the ballasting resistor 78 provides the drain-side of the device structure 72 with an enhanced resistance in comparison with a typical field-effect transistor.

Figure 8:
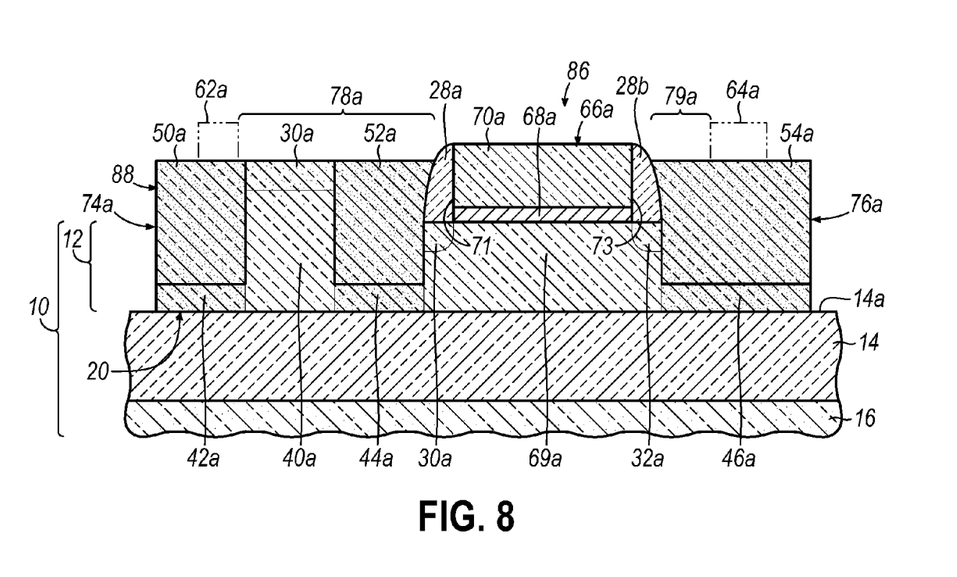
FIG. 8 is a cross-sectional view similar to FIG. 6 of a self-protected field-effect transistor in accordance with an alternative embodiment of the invention.

With reference to FIG. 8 in which like reference numerals refer to like features in FIG. 6 and in accordance with an alternative embodiment, a device structure 86 may be fabricated using nominally the same fabrication process used to fabricate device structure 72. Device structure 86, which is a fin-type field-effect transistor, includes epitaxial layers 50a, 52a, 54a nominally identical to epitaxial layers 50, 52, 54 and doped regions 42a, 44a, 46a nominally identical to doped regions 42, 44, 46, as well as doped regions 30a, 32a nominally identical to doped regions 30, 32. These regions are formed in a fin 88 constituted by a three-dimensional block of semiconductor material originating from the device layer 12 and which replaces the device region 20 of device structure 72. The fin 88 has a bottom surface that may be in direct contact with the top surface 14a of the buried insulator layer 14. Device structure 86 further includes a functional gate structure 66a nominally identical to the functional gate structure 66 of device structure 72 and having a gate dielectric 68a and gate electrode 70a nominally identical to the gate dielectric 68 and gate electrode 70 of functional gate structure 66. The functional gate structure 66a may have portions on the top surface 14a that flank opposite sidewalls of the fin 88 and another portion that intersects the fin 88.

The device structure 86 includes a drain 74a and a source 76a, as well as a ballasting resistor 78a disposed between the drain 74a and the functional gate structure 66a and a ballasting resistor 79a disposed between the source 76a and the functional gate structure 66a. The ballasting resistor 78a comprises the epitaxial layer 52a, the doped region 44a, a portion 40a of the fin 88 between the trenches occupied by the epitaxial layers 50a, 52a, a section of doped region 30a in the portion 40a, and a portion of the epitaxial layer 50a and doped region 42a between a contact 62a and the doped region 30a and portion 40a. In other words, the ballasting resistor 78a includes features laterally positioned in the device layer 12 between the contact 62a and the spacer 28a on the sidewall 71a of the functional gate structure 66a. The ballasting resistor 79a comprises the portions of the epitaxial layer 54a and doped region 46a between a contact 64a and a channel 69a. In other words, the ballasting resistor 79a includes features in the fin 88 laterally positioned between the contact 64a and the spacer 28b on the sidewall 73a of the functional gate structure 66a.

Figure 9:
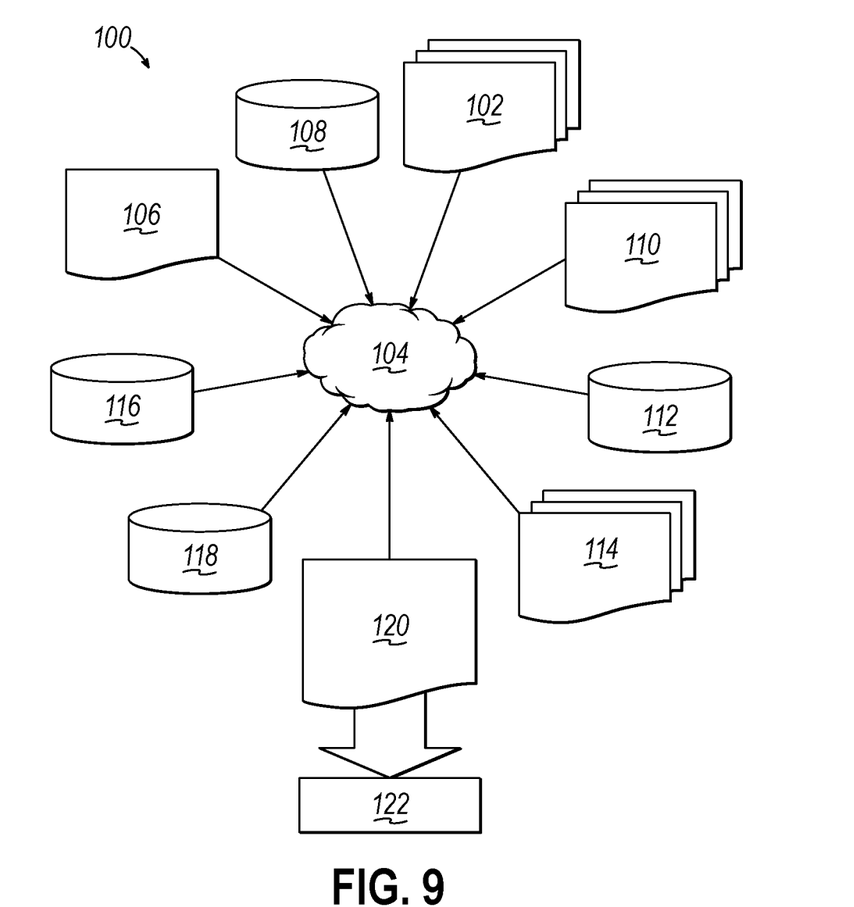
FIG. 9 is a flow diagram of a design process used in semiconductor design, manufacture, and/or test.

FIG. 9 shows a block diagram of an exemplary design flow 100 used for example, in semiconductor IC logic design, simulation, test, layout, and manufacture. Design flow 100 includes processes, machines and/or mechanisms for processing design structures or devices to generate logically or otherwise functionally equivalent representations of the design structures and/or devices described above and shown in FIGS. 6, 8. The design structures processed and/or generated by design flow 100 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g., e-beam writers), computers or equipment for simulating design structures, any apparatus used in the manufacturing or test process, or any machines for programming functionally equivalent representations of the design structures into any medium (e.g., a machine for programming a programmable gate array).

Design flow 100 may vary depending on the type of representation being designed. For example, a design flow 100 for building an application specific IC (ASIC) may differ from a design flow 100 for designing a standard component or from a design flow 100 for instantiating the design into a programmable array, for example a programmable gate array (PGA) or a field programmable gate array (FPGA) offered by Altera® Inc. or Xilinx® Inc.

FIG. 9 illustrates multiple such design structures including an input design structure 102 that is preferably processed by a design process 104. Design structure 102 may be a logical simulation design structure generated and processed by design process 104 to produce a logically equivalent functional representation of a hardware device. Design structure 102 may also or alternatively comprise data and/or program instructions that when processed by design process 104, generate a functional representation of the physical structure of a hardware device. Whether representing functional and/or structural design features, design structure 102 may be generated using electronic computer-aided design (ECAD) such as implemented by a core developer/designer. When encoded on a machine-readable data transmission, gate array, or storage medium, design structure 102 may be accessed and processed by one or more hardware and/or software modules within design process 104 to simulate or otherwise functionally represent an electronic component, circuit, electronic or logic module, apparatus, device, or system such as those shown in FIGS. 6, 8. As such, design structure 102 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 104 preferably employs and incorporates hardware and/or software modules for synthesizing, translating, or otherwise processing a design/simulation functional equivalent of the components, circuits, devices, or logic structures shown in FIGS. 7-11 to generate a netlist 106 which may contain design structures such as design structure 102. Netlist 106 may comprise, for example, compiled or otherwise processed data structures representing a list of wires, discrete components, logic gates, control circuits, I/O devices, models, etc. that describes the connections to other elements and circuits in an integrated circuit design. Netlist 106 may be synthesized using an iterative process in which netlist 106 is resynthesized one or more times depending on design specifications and parameters for the device. As with other design structure types described herein, netlist 106 may be recorded on a machine-readable data storage medium or programmed into a programmable gate array. The medium may be a nonvolatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 104 may include hardware and software modules for processing a variety of input data structure types including netlist 106. Such data structure types may reside, for example, within library elements 108 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 110, characterization data 112, verification data 114, design rules 116, and test data files 118 which may include input test patterns, output test results, and other testing information. Design process 104 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 104 without deviating from the scope and spirit of the invention. Design process 104 may also include modules for performing standard circuit design processes such as timing analysis, verification, design rule checking, place and route operations, etc.

Design process 104 employs and incorporates logic and physical design tools such as HDL compilers and simulation model build tools to process design structure 102 together with some or all of the depicted supporting data structures along with any additional mechanical design or data (if applicable), to generate a second design structure 120. Design structure 120 resides on a storage medium or programmable gate array in a data format used for the exchange of data of mechanical devices and structures (e.g., information stored in an IGES, DXF, Parasolid XT, JT, DRG, or any other suitable format for storing or rendering such mechanical design structures). Similar to design structure 102, design structure 120 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 6, 8. In one embodiment, design structure 120 may comprise a compiled, executable HDL simulation model that functionally simulates the devices shown in FIGS. 6, 8.

Design structure 120 may also employ a data format used for the exchange of layout data of integrated circuits and/or symbolic data format (e.g. information stored in a GDSII (GDS2), GL1, OASIS, map files, or any other suitable format for storing such design data structures). Design structure 120 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 6, 8. Design structure 120 may then proceed to a stage 122 where, for example, design structure 120: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It will be understood that when an element is described as being "connected" or "coupled" to or with another element, it can be directly connected or coupled to the other element or, instead, one or more intervening elements may be present. In contrast, when an element is described as being "directly connected" or "directly coupled" to another element, there are no intervening elements present. When an element is described as being "indirectly connected" or "indirectly coupled" to another element, there is at least one intervening element present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of fabricating a device structure using a substrate, the method comprising:
    forming a doped region that intersects the top surface of the substrate;
    forming a first gate structure on the top surface of the substrate;
    forming a first trench in the substrate that extends through the doped region adjacent to a first sidewall of the first gate structure;
    forming a second trench in the substrate that extends through the doped region adjacent to the first sidewall of the first gate structure and laterally between the first trench and the first sidewall so that a portion of the doped region laterally separates the first trench from the second trench;
    forming a first epitaxial layer in the first trench;
    forming a second epitaxial layer in the second trench; and
    forming a contact to the first epitaxial layer,
    wherein the second epitaxial layer in the second trench is not contacted, the first epitaxial layer, the second epitaxial layer, and the portion of the doped region have the same conductivity type, and the first epitaxial layer comprises a drain of a field-effect transistor, and the second epitaxial layer and the doped region comprise respective portions of a first ballasting resistor coupled with the drain of the field-effect transistor.

2. The method of claim 1 wherein the substrate comprises a silicon-on-insulator substrate including a buried insulator layer and a device layer on the buried insulator layer, and the first and second trenches extend from a top surface of the device layer only partially through a thickness of the device layer so that a first thinned region of the device layer vertically separates the first trench from a top surface of the buried insulator layer and a second thinned region of the device layer vertically separates the second trench from the top surface of the buried insulator layer.

3. The method of claim 2 further comprising:
    before forming the first epitaxial layer in the first trench and the second epitaxial layer in the second trench, doping the first and second thinned regions of the device layer to have the same conductivity type as the first epitaxial layer and the second epitaxial layer.

4. The method of claim 2 wherein the first thinned region of the device layer functions as a seed for the formation of the first epitaxial layer and the second thinned region of the device layer functions as a seed for the formation of the second epitaxial layer.

5. The method of claim 1 wherein the substrate comprises a silicon-on-insulator substrate including a buried insulator layer and a device layer on the buried insulator layer, and the doped region is formed in a top portion of the device layer between the first trench and the second trench, and the portion of the doped region couples the first epitaxial layer with the second epitaxial layer.

6. The method of claim 5 wherein the doped region extends from a top surface of the device layer only partially through a thickness of the device layer.

7. The method of claim 5 further comprising:
forming a third trench adjacent to a second sidewall of the first gate structure that is opposite to the first sidewall; and
forming a third epitaxial layer in the third trench,
wherein the third epitaxial layer comprises a source of the field-effect transistor.

8. The method of claim 1 further comprising:
removing the first gate structure; and
forming a second gate structure within a space formerly occupied by the first gate structure,
wherein the second gate structure is functional.

9. The method of claim 1 further comprising:
forming a third trench adjacent to a second sidewall of the first gate structure that is opposite to the first sidewall; and
forming a third epitaxial layer in the third trench,
wherein the third epitaxial layer comprises a source of the field-effect transistor.

* * * * *